(12) United States Patent
Jeon

(10) Patent No.: US 8,933,830 B1
(45) Date of Patent: Jan. 13, 2015

(54) SUCCESSIVE APPROXIMATION REGISTER ANALOG-TO-DIGITAL CONVERTER AND METHOD OF OPERATING BUILT-IN SELF-TEST DEVICE FOR TESTING THE CONVERTER

(71) Applicant: Electronics and Telecommunications Research Institute, Daejeon (KR)

(72) Inventor: Young-deuk Jeon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 14/178,187

(22) Filed: Feb. 11, 2014

(30) Foreign Application Priority Data

Jul. 24, 2013 (KR) ........................ 10-2013-0087535

(51) Int. Cl.
*H03M 1/00* (2006.01)
*H03M 1/10* (2006.01)
*H03M 1/12* (2006.01)

(52) U.S. Cl.
CPC .............. *H03M 1/1071* (2013.01); *H03M 1/12* (2013.01); *H03M 1/00* (2013.01)
USPC ......................................... 341/110; 341/155

(58) Field of Classification Search
CPC .................................. H03M 1/00; H03M 1/12
USPC ................................... 341/110, 120, 155, 156
See application file for complete search history.

(56) References Cited

U.S. PATENT DOCUMENTS 7,414,554 B1 * 8/2008 Tsyrganovich ............... 341/120

FOREIGN PATENT DOCUMENTS

| KR | 10-2000-0044683 A | 7/2000 |
| KR | 10-2008-0010580 A | 1/2008 |
| KR | 10-2013-0026627 A | 3/2013 |

OTHER PUBLICATIONS

Dai Zhang et al., "Design of CMOS Sampling Switch for Ultra-Low Power ADCs in Biomedical Applications", NORCHIP, 2010, pp. 1-4, IEEE.

* cited by examiner

*Primary Examiner* — Joseph Lauture

(57) ABSTRACT

Provided is a successive approximation register analog-to-digital converter (SAR ADC) including a digital-to-analog converter (DAC) generating and outputting first and second level voltages based on first and second analog input signals and a reference voltage signal; a comparator comparing the first and second level voltages and outputting a comparison signal according to a comparison result; and an SAR logic generating a digital signal based on the comparison signal, wherein the DAC includes: first and second input switches controlling reception of the first and second analog input signals, respectively; a first discharge switch connected electrically to the first input switch, the first discharge switch discharging leakage current according to an operation of the first input switch; and a second discharge switch connected electrically to the second input switch, the second discharge switch discharging leakage current according to an operation of the second input switch.

13 Claims, 7 Drawing Sheets

SUCCESSIVE APPROXIMATION REGISTER ANALOG-TO-DIGITAL CONVERTER AND METHOD OF OPERATING BUILT-IN SELF-TEST DEVICE FOR TESTING THE CONVERTER

CROSS-REFERENCE TO RELATED APPLICATIONS

This U.S. non-provisional patent application claims priority under 35 U.S.C. §119 of Korean Patent Application No. 10-2013-0087535, filed on Jul. 24, 2013, the entire contents of which are hereby incorporated by reference.

BACKGROUND OF THE INVENTION

The present invention disclosed herein relates to an analog-to-digital converter (ADC), and more particularly, to a successive approximation register ADC and method of operating a built-in self-test (BIST) device for testing the converter.

An analog-to-digital converter (ADC) receives an analog input voltage and converts the voltage into a digital signal. The digital signal may be transmitted to other devices. A successive approximation register (SAR) ADC has a structure in which a comparator is repetitively used. Since the SAR ADC does not have an analog circuit such as a multiplying digital ADC and a sample and hold S/H circuit, it has a simple structure. Thus, it occupies a narrower area and consumes less power, as compared to other ADCs. Also, the SAR ADC is easily applied to a low-voltage circuit.

The SAR ADC may receive output signals from sensors and convert them into digital signals. General sensors have a single-voltage output. Thus, the SAR ADC that converts the signals output from the sensors into digital signals needs to have a single-ended input structure. The SAR ADC includes an SAR logic, a comparator, and a digital-to-analog converter (DAC).

A differential pre-amplifier and a latch may be used as a comparator for comparing the output of the DAC. In this case, the SAR ADC performs a conversion operation by comparing level voltages that are generated based on a digital bit and analog input voltage sampled on a capacitor.

When an output range of a sensor having a single voltage as an output is within a range of a supply voltage Vdd, the voltage of a node connected to the top plate of a capacitor may be higher than the supply voltage Vdd. In this case, due to the malfunction of switches connected to the node having a voltage higher than the supply voltage Vdd, charges stored in the capacitor may be lost and the reliability of the SAR ADC may decrease.

SUMMARY OF THE INVENTION

The present invention provides a successive approximation register analog-to-digital converter (ADC) and method of operating a built-in self-test device (BIST) for testing the converter that have enhanced reliability.

Embodiments of the present invention provide successive approximation register analog-to-digital converters (SAR ADCs) including a digital-to-analog converter (DAC) generating and outputting first and second level voltages based on first and second analog input signals and a reference voltage signal; a comparator comparing the first and second level voltages and outputting a comparison signal according to a comparison result; and an SAR logic generating a digital signal based on the comparison signal, wherein the DAC includes: first and second input switches controlling reception of the first and second analog input signals, respectively; a first discharge switch connected electrically to the first input switch, the first discharge switch discharging leakage current according to an operation of the first input switch; and a second discharge switch connected electrically to the second input switch, the second discharge switch discharging leakage current according to an operation of the second input switch.

In other embodiments of the present invention, methods of operating a built-in self-test (BIST) device for testing a successive approximation register analog-to-digital converter (SAR ADC) including storing first and second output codes in response to first and second input voltages; outputting a gain error based on a calculation result of a difference between the stored first and second output codes and a first normal code according to the second input voltage; storing third and fourth output codes in response to the second input voltage and the third input voltage; outputting an offset error based on a calculation result of the stored third output code and the first normal code; and outputting an integral non-linearity (INL) error based on a calculation result of a difference between the stored third and fourth output codes and a second normal code according to the third input voltage, wherein the SAR ADC receives a signal corresponding to the offset error from the BIST device and outputs an offset-corrected digital signal.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
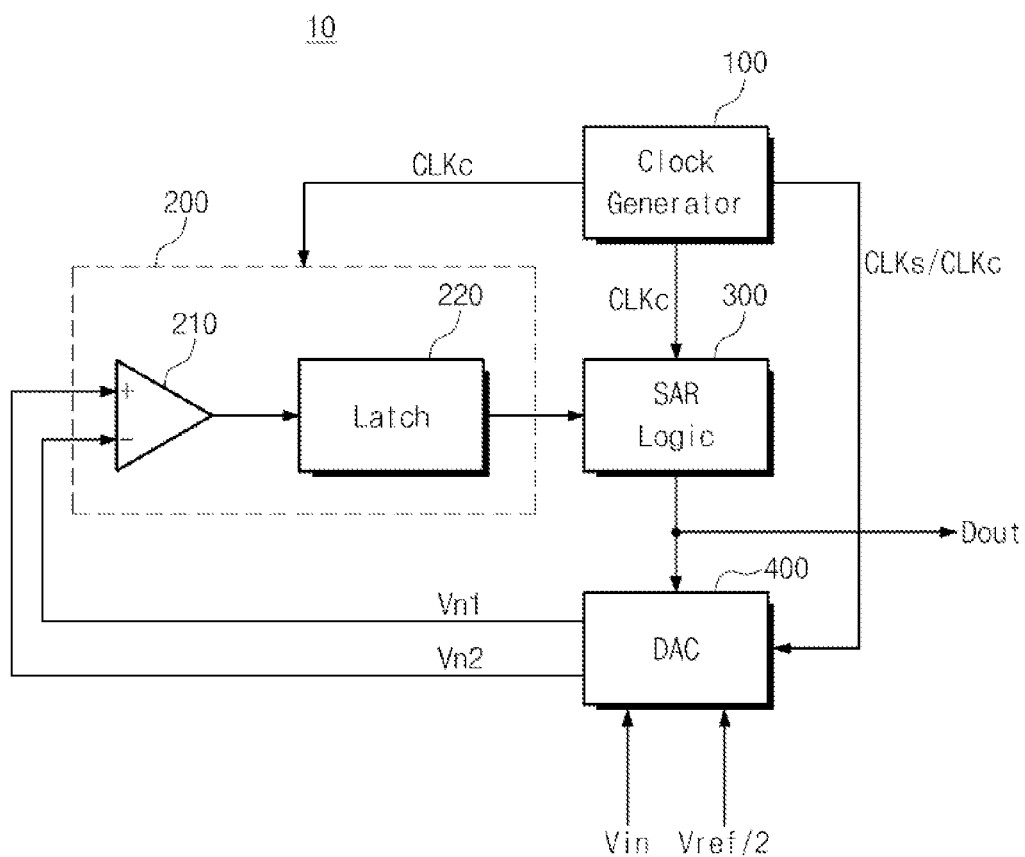
FIG. 1 is a block diagram of a successive approximation register analog-to-digital converter (SAR ADC) according to an embodiment of the present invention.

In order to prescribe the present invention in detail so that a person skilled in the art may easily practice the technical spirits of the present invention, embodiments of the present invention are described below with reference to the accompanying drawings. The same components are denoted by using the same reference numerals. Like components are denoted by using similar reference numerals. A successive approximation register analog-to-digital converter (SAR ADC) according to the present invention to be described below and operations to be performed by using the SAR ADC are merely described as examples, and many variations and alterations may be made within the scope of the technical spirit of the present invention.

FIG. 1 is a block diagram of a successive approximation register analog-to-digital converter (SAR ADC) according to an embodiment of the present invention. Referring to FIG. 1, an SAR ADC 10 includes a clock generator 100, a comparator 200, an SAR logic 300, and a digital-to-analog converter (DAC) 400.

The clock generator 100 may generate a sampling clock CLKs and a conversion clocks CLK. The sampling clock CLKs and the conversion clock CLKc are delivered to the DAC 400 and the conversion clock CLKc is delivered to the comparator 200, the SAR logic 300, and the DAC 400. In the embodiment, the sampling clock CLKs and the conversion clock CLKc may be reversed clocks. As an example, the DAC 400 may sample an input voltage Vin in response to the sampling clock CLKs. Also, the DAC 400 may generate first and second voltage levels Vn1 and Vn2 in response to the conversion clock CLKc.

The comparator 200 compares the generated first and second level voltages Vn1 and Vn2. Specifically, the comparator 200 includes a differential pre-amplifier 210 and a latch 220. The differential pre-amplifier 210 receives the first and second level voltages Vn1 and Vn2 from the DAC 400 and compares the received first and second level voltages Vn1 and Vn2. The differential pre-amplifier 210 amplifies the comparison result and delivers the amplified result to the latch 200. In the embodiment, the differential pre-amplifier 210 may have any one of an NMOS input and a PMOS input.

The latch 220 may store any one of "data 0" or "data 1" based on the comparison result amplified from the differential pre-amplifier 210. For example, if the first level voltage Vn1 is higher the second level voltage Vn2, the latch 220 stores the "data 1". If the first level voltage Vn1 is lower than the second level voltage Vn2, the latch 220 stores the "data 0".

The SAR logic 300 may determine a digital bit based on the data stored in the latch 220, in response to the conversion clock CLKc. For example, the SAR ADC 10 may receive and convert an analog input Vin into a 3-bit digital signal. In a first conversion operation, all capacitors (shown in FIG. 2) are connected to a common mode voltage Vcm by a decoding logic included in the DAC 400 and, the digital signals of the SAR logic 300 are reset to logic low. The comparator 200 determines most significant bit (MSB) and stores MSB determined from the latch 220.

The SAR logic 300 determines MSB based on the data stored in the latch 220, in response to the conversion clock CLKc. If the "data 1" is stored in the latch 220, the SAR logic 300 determines the MST as logic high. If the "data 0" is stored in the latch 220, the SAR logic 300 determines the MSB as logic low.

The SAR logic 300 determines the MSB and then delivers the determined MSB to the decoding logic included in the DAC 400. The SAR logic 300 may determine least significant bit (LSB) through the repetition of the above-described operations.

The DAC 400 receives the analog input voltage Vin, a reference voltage Vref, and a digital signal Dout from the SAR logic 300. The DAC 400 may output the first and second level voltages Vn1 and Vn2 based on the received voltages and digital signal Dout. In the embodiment, the analog input voltage Vin may implemented as a first analog input voltage Vin_a (shown FIG. 2) and a second analog input voltage Vin_b (shown in FIG. 2) and applied to the DAC 400. Also, the reference voltage Vref may be implemented as first and second reference voltages Vrefp and Vrefn. The first reference voltage Vrefp may be ½ times the supply voltage Vdd and the second reference voltage Vrefn may be 0 V.

The DAC 400 samples the first and second analog input voltages Vin_a and Vin_b in response to the sampling clock CLKs. The DAC 400 may generate the first and second level voltages Vn1 and Vn2 in response to the conversion clock CLKc. Also, the level voltage is used for determining the voltage level of the analog input voltage Vin and is a value that is obtained by properly distributing the reference voltage Vref based on the digital resolution of the ADC. In the embodiment, the DAC 400 may be a capacitive DAC that operates based on charge redistribution.

In the embodiment, the SAR ADC 10 has a single-ended input structure and the analog input voltage Vin applied to the DAC 400 may have a voltage level from 0 V to the supply voltage VDD. Also, the voltage level of the reference voltage Vref may generally have a level of the supply voltage VDD. As an example, if the voltage level of the supply voltage VDD according to the analog input voltage is 5 V, the voltage level of the reference voltage Vref also becomes 5 V.

However, as an example, a battery attached to a vehicle may vary in the voltage level of the battery depending on an external condition and a drive operation. For example, if the level of the supply voltage VDD applied from the battery to the DAC is lower than the normal supply voltage VDD of the analog input voltage Vin, the operation of the DAC may have a problem.

Thus, in the SAR ADC 10 according to the embodiment of the present invention is applied, the reference voltage Vref that is ½ times the supply voltage VDD is applied to the DAC 400. The DAC 400 may receive the reference voltage Vref set as ½ times the supply voltage VDD to be able to stably perform the turn-on operation of a switch. Related descriptions are provided in detail through FIG. 2.

Figure 2:
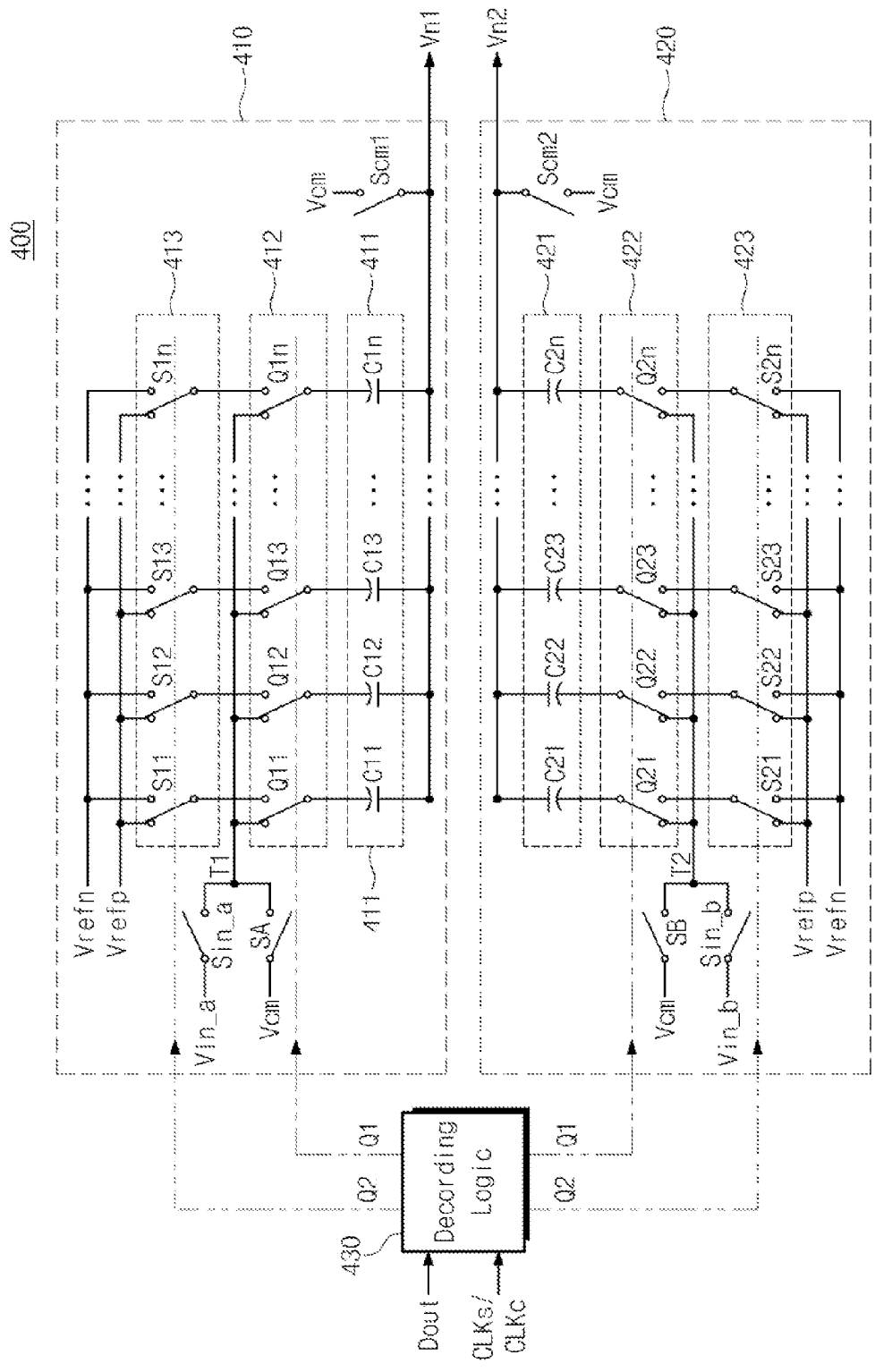
FIG. 2 is a circuit diagram of a digital-to-analog converter (DAC) shown in FIG. 1.

FIG. 2 is a circuit diagram of the DAC shown in FIG. 1. Referring to FIG. 2, the DAC 400 includes a first conversion unit 410, a second conversion unit 420, and a decoding logic 430. The analog input voltage Vin may be implemented as first and second analog input voltages Vin_a and Vin_b. As an example, the first analog input voltage Vin_a may be implemented as an input voltage having a level of the supply voltage VDD and the second analog input voltage Vin_b may be implemented as the common mode voltage Vcm.

Also, for simplicity, the operation of the DAC 400 is described based on the process of determining MSB.

It is assumed that the top plate of first and second capacitor arrays 411 and 421 indicates a surface where the first and second capacitor arrays 411 and 421 are connected to nodes from which the first and second level voltages Vn1 and Vn2 are output. It is assumed that the bottom plate of first and second capacitor arrays 411 and 421 indicates a surface of the third and fourth capacitor arrays 411 and 421 that is connected to first and third switch arrays 412 and 422.

In the embodiment, the digital logic 430 may generate a first control signal Q1 in response to the sampling clock CLKs. Also, the digital logic 430 may generate a second control signal Q2 in response to the conversion clock CLKc.

The first conversion unit 410 generates the first level voltage Vn1. Specifically, the first conversion unit 410 includes the first capacitor array 411, the first switch array 412, a second switch array 413, and a common mode switch Scm, a first input switch Sin_a, and a first discharge switch SA.

The first capacitor array 411 includes a plurality of capacitors C11 to C1$n$. The number of the capacitors C11 to C1$n$ may be determined depending on the digital resolution of the SAR ADC 10. For example, when the SAR ADC 10 has a 10-bit digital resolution, the first capacitor array 411 includes ten capacitors. The ten capacitors have different capacitances, respectively. The first conversion unit 410 may generate the first level voltage Vn1 based on charge redistribution.

The first switch array 412 includes a plurality of switches Q11 to Q1$n$. In response to the first control signal Q1, the switches Q11 to Q1$n$ may operate so that the first analog input voltage Vin_a is supplied to the bottom plate of the first capacitor array 411. Specifically, the switches Q11 to Q1$n$ operate so that the first analog input voltage Vin_a may be supplied, when the first control signal Q1 is transited to a high level. Also, the switches Q11 to Q1$n$ operate so that the first analog input voltage Vin_a is not supplied to the first capacitor array 411, when the first control signal Q1 is transited to a low level.

The second switch array 413 includes a plurality of switches S11 to S1$n$. In response to the second control signal Q2, the switches S11 to S1$n$ may operate so that any one of the first reference voltage Vrefp and the second reference voltage Vrefn to the bottom plate of the first capacitor array 141.

As an example, the MSB of the digital signal Dout received when determining MSB would be logic high. In response to the conversion clock CLKc, the decoding logic 430 may control the first switch S11 so that the first reference voltage Vrefp is supplied to the bottom plate of the capacitor C11. Generally, the decoding logic 430 may control the other switches S12 to S1$n$ so that the common mode voltage Vcm is supplied to the bottom plate of the remaining capacitors C12 to C1$n$ other than the capacitor C11.

However, the first and second conversion units 410 and 420 of the present invention do not include a node for applying the common mode voltage Vcm. Instead, the DAC 400 according to the embodiment of the present invention applies the same first or second reference voltage Vrefp or Vrefn to both the first and second conversion units 410 and 420 for the implementation of the common mode voltage Vcm. Thus, a voltage having the effect of the common mode voltage Vcm may be applied to the bottom plate of the remaining capacitors C12 to C1$n$ other then the capacitor C11.

In response to the first control signal Q1, a first common mode switch Scm1 may be connected so that the common mode voltage Vcm is supplied to the top plate of the first capacitor array 411. In the embodiment, the common mode voltage Vcm may be ½ times the supply voltage VDD.

The first discharge switch SA may prevent a leakage current from flowing on the first capacitor array 411, namely, through a first node T1. In the embodiment, the first input switch Sin_a and the first discharge switch SA may be implemented as a CMOS transistor.

Specifically, the turn-off operation of an NMOS transistor according to the first input switch Sin_a may be controlled by applying 0 V. However, the turn-off operation of a PMOS transistor according to the first input switch Sin_a may be adjusted by a level of the supply voltage VDD and the first analog input voltage Vin_a. In the turn-off operation of the first input switch Sin_a, the level of the supply voltage VDD controlling the operation of the first input switch Sin_a becomes lower than that of the first analog input voltage Vin_a according to an external condition and a drive operation and thus a leakage current may flow through the first node and the bottom plate of the first capacitor array 411.

The first discharge switch SA according to the present invention may discharge the leakage current flowing through the first node T1 from the first input switch Sin_a, externally, namely, through a common mode voltage Vcm terminal Specifically, the first input switch Sin_a and the first discharge switch SA may operate complementarily. If the turn-off operation of the first input switch Sin_a is completely performed, a leakage current may flow through the first node T1. The leakage current may be not applied to the first capacitor array 411 through the first node T1 but discharged to the common mode voltage Vcm terminal through the first discharge switch SA.

In the embodiment, the common mode voltage Vcm may be set as ½ times the supply voltage VDD. If the first input switch Sin_a is turned off, a voltage of VDD/2 may be applied to the first node T1 in response to the common mode voltage Vcm applied through the first discharge switch SA. Also, in the embodiment, the first reference voltage Vrefp may be set as ½ times the supply voltage VDD.

The second conversion unit 420 generates the second level voltage Vn1. Specifically, the second conversion unit 420 includes the second capacitor array 421, the third switch array 422, a fourth switch array 423, a second common mode switch Scm2, a second input switch Sin_b, and a second discharge switch SB.

The operation of the second conversion unit 420 is similar to that of the first conversion unit 410 and outputs the second level voltage Vn2. When compared to the first conversion unit 420, the second conversion unit 420 may operate as a differential structure. Thus, the operation of the second conversion unit 420 is not described because it may be understood with reference to that of the first conversion unit 410.

The decoding logic 430 may receive the digital signal Dout from the SAR logic 300. Also, the decoding logic 430 may receive the sampling clock CLKs and the conversion clock CLKc. The decoding logic 430 generates the first and second control signals Q1 and Q2 for controlling the first and second conversion units 410 and 420, in response to the sampling clock CLKs and the conversion clock CLKc.

As described above, the DAC 400 may sample the first and second analog input voltages Vin_a and Vin_b on the first and second capacitor arrays 411 and 421 respectively, in response to the first control signal Q1. The first and second conversion units 410 and 420 generate the first and second level voltages Vn1 and Vn2 based on the first and second analog input voltages Vin_a and Vin_b. The SAR logic 300 (See FIG. 1) may determine a digital bit based on the difference between the generated first and second level voltages Vn1 and Vn2. The SAR ADC 10 (See FIG. 1) may convert the analog input voltage Vin into the digital signal Dout based on the repetition of these operations and output and output the digital signal.

Figure 3:
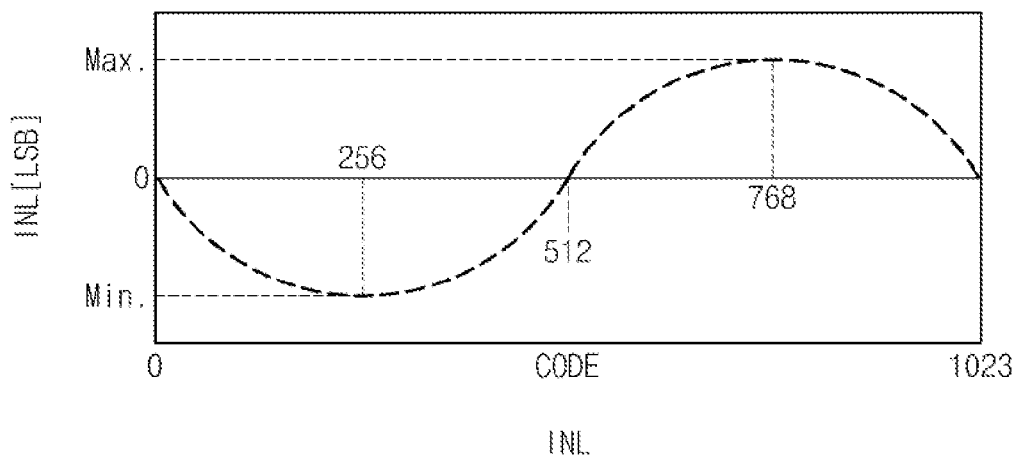
FIG. 3 is a graph showing an integral non-linearity (INL) measurement of the SAR ADC.
Figure 4:
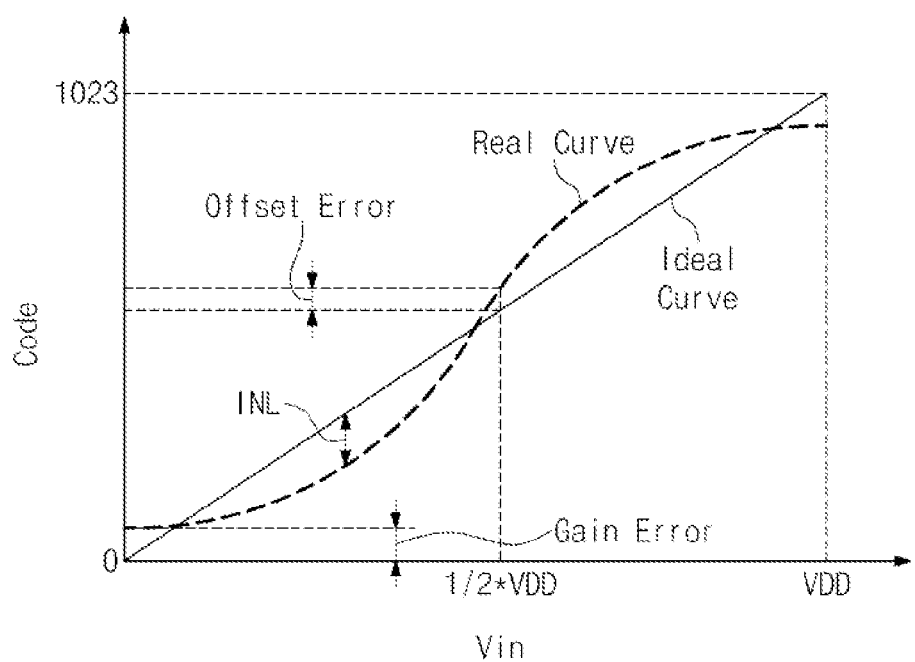
FIG. 4 is an example showing the operative characteristics of the SAR ADC.

FIGS. 3 and 4 are graphs showing integral non-linearity (INL) measurement of the SAR ADC and the characteristics of a code according to an analog input voltage. As an example, it is described that a 10-bit code is output from the SAR ADC 10 (See FIG. 1). Referring to FIG. 3, the horizontal axis is the output code of the SAR ADC 10 and the vertical axis shows the INL according to an output code. As an example, the output code of the SAR ADC 10 may be 10-bit based 1024 codes. The INL has a minimum at code 256 and zero at code 512. Also, it may be seen that the INL measurement graph shown in FIG. 3 has bilateral symmetry at the code 512.

Referring to FIG. 4, the horizontal axis represents the analog input voltage Vin applied to the DAC 400 (See FIG. 1) and the vertical axis represents the output of the code. The SAR ADC 10 may output a code having a linear ideal curve, in response to the analog input voltage Vin. However, due to an offset error, a gain error, and the INL, a real curve may not match the ideal curve.

A built-in self-test (BIST) device may analyze the digital signal Dout output from the SAR ADC 10 (See FIG. 1) and monitor the offset error, the gain error, and an INL value. The operation of the BIST device is described in detail through FIG. 5.

Figure 5:
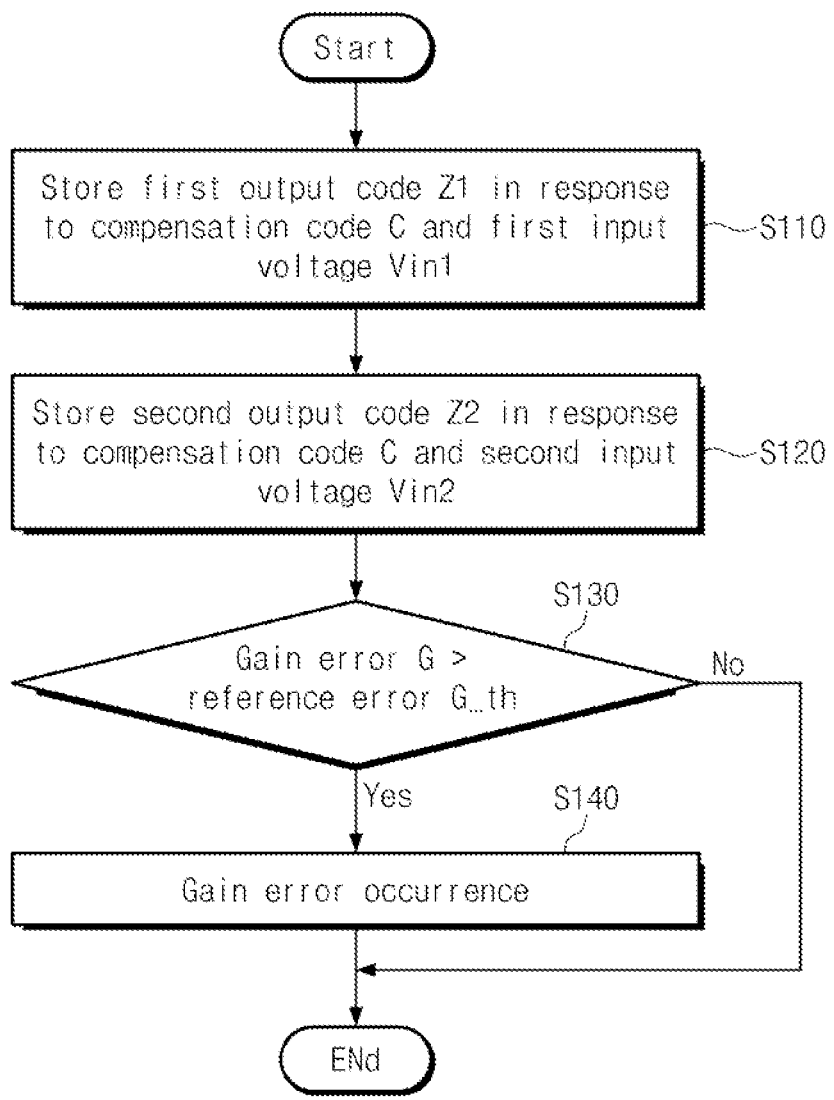
FIG. 5 is a flow chart showing a test operation on a gain error according to a built-in self-test (BIST) algorithm of the present invention.
Figure 6:
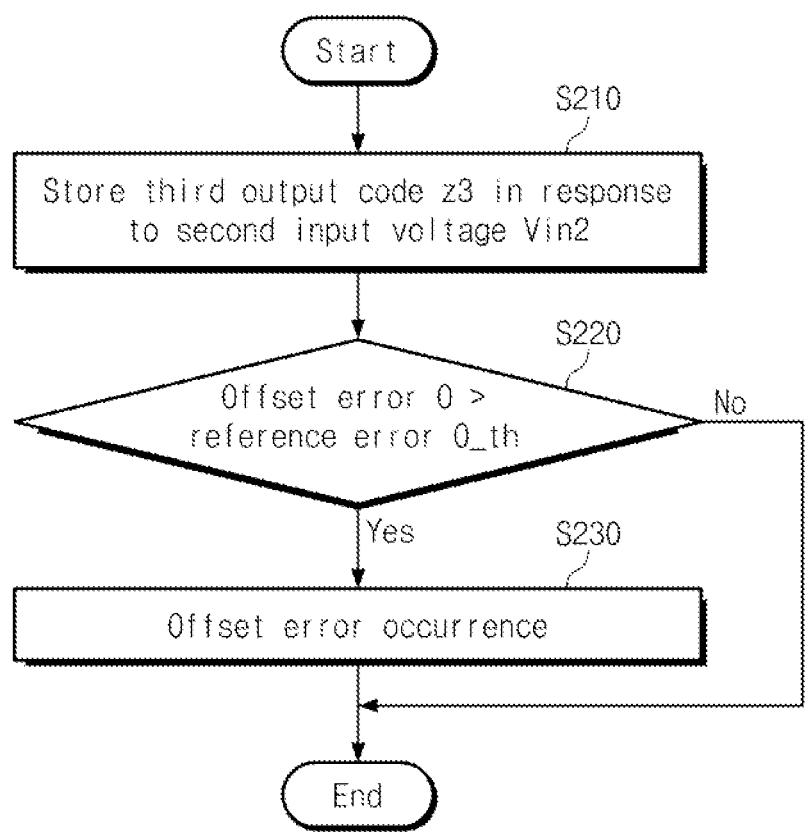
FIG. 6 is a flow chart showing a test operation on an offset error according to the built-in self-test (BIST) algorithm of the present invention.
Figure 7:
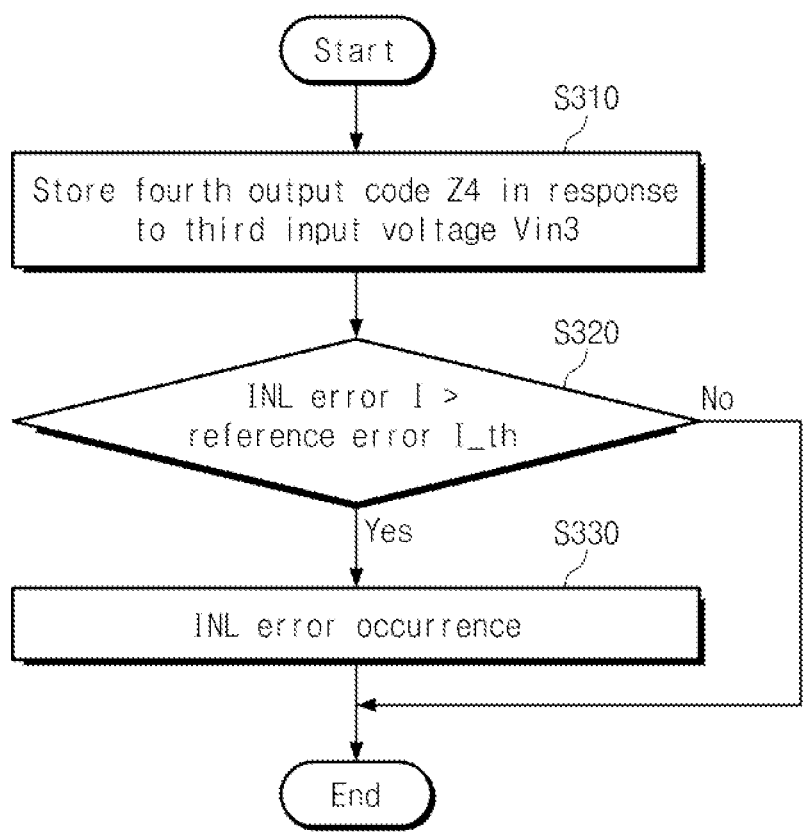
FIG. 7 is a flow chart showing a test operation on an INL error according to the built-in self-test (BIST) algorithm of the present invention.

FIGS. 5 to 7 are flow charts showing the algorithms of the BIST device according to embodiments of the present invention. Referring to FIGS. 3 to 7, the performance of the SAR ADC 10 (See FIG. 1) may be monitored according to the gain error G, the offset error O and the INL result that are measured from the BIST device. When the above-described three errors do not exist, codes may be detected in the shape of the ideal curve shown in FIG. 4. However, when the above-described three errors occur, a curve having an error may be detected through a comparison with the ideal curve.

Referring to FIG. 5, in steps S110 and S120, the BIST device may store a first output code Z1, in response to a compensation code C and the first input voltage Vin1, in step S110. Also, the BIST device may store a second output code Z2 in response to the compensation code and the second input voltage Vin2, in step S120. The BIST device may detect the gain error G in response to the calculation result of the first and second output codes Z1 and Z2.

Specifically, the gain error G may be found through the difference between two codes that are output according to values. The values are ½ times the supply voltage VDD and the analog input voltage Vin of 0 V. As an example, the first input voltage Vin1 may be 0 V, and the second input voltage Vin2 may be ½ times the supply voltage VDD. For example, in the case of the 10-bit based ideal curve, the code output according to the first input voltage Vin1 may be 0 and the code output according to the second input voltage Vin2 may be 512.

However, based on an external condition according to the process of manufacturing the SAR ADC, a minus code may be output in response to the first input voltage Vin1. In other words, the code 0 may be output according to the first input voltage Vin1 and the code 512 may be output according to the second input voltage Vin2 and thus it is not possible to obtain an exact gain error G result. Thus, in response to when the minus code is output, the compensation code C may be set to code I0 as an example.

In third step S130, the BIST device may compare a measurement of the grain error G with a preset reference error G_th based on the first and second output codes Z1 and Z2.

$$\text{Gain error } G = |(Z2-Z1)-I1| \times 2 \qquad \text{<Equation 1>}$$

Referring to Equation 1, the gain error G may be obtained by subtracting the first output code Z1 from the second output code Z2, subtract a first normal code I1 from the value obtained through the subtraction and then taking two times ×2 the value obtained through the last subtraction. As an example, the first normal code I1 may be a code output in response to the second input voltage Vin, based on the ideal curve (See FIG. 4). In the case of a 10-bit based ideal curve, the first normal code I1 may be 512. Also, the reason for the square X2 is that output codes have bilateral symmetry at the first normal code I1 as shown in FIG. 4. Thus, it is possible to detect the whole gain error G by detecting a left or right gain error and taking two times ×2 the detected error.

Also, in fourth step S140, if the measured gain error G is greater than the preset reference error G_th (if YES), the BIST device makes an alarm relative to the gain error G. The BIST device ends the monitoring operation if the measured gain error G is less than the preset reference error G_th (if NO).

Referring to FIG. 6, in first step S210, the BIST device may store a third output code Z3 in response to the second input voltage Vin2. The BIST device may measure the offset error O in response to a calculation result according to the third output code Z3.

In second step S220, the BIST device may compare a measurement of the offset error O with a preset reference error Ot_h based on the third output code Z3.

$$\text{Offset error } O = |Z3-I1| \qquad \text{<Equation 2>}$$

Referring to Equation 2, the third output code Z3 may be an output code obtained in response to the second input voltage Vin2. The first normal code I1 may be a code output in response to the second input voltage Vin, based on the ideal curve. For example, in the case of the 10-bit based ideal curve, the first normal code I1 may be 512. The BIST device may measure the offset error O by subtracting the first normal code I1 from the third output code Z3.

In third step S230, if the measured offset error O is greater than the preset reference error O_th (if YES), the BIST device makes an alarm relative to the offset error O. The BIST device ends the monitoring operation if the measured offset error O is less than the preset reference error O_th.

Also, in the embodiment, the SAR ADC 10 according to the present invention receives the measured offset error O from the BIST device. The SAR ADC 10 may output an offset-corrected digital signal based on the received offset error O.

Referring to FIG. 7, in first step S310, the IBST device may store a fourth output code Z4 in response to a third input voltage Vin3. The BIST device may measure the INL in response to calculation results according to the third and fourth output codes Z3 and Z4. As shown in FIGS. 3 and 4, the BIST device according to the present invention measures the INL according to a minimum Min, based on that the difference between the minimum Min and a maximum of the INL has symmetry within a certain range. As an example, the third input voltage Vin3 may be set to ¼ times the supply voltage VDD for measuring the minimum Min of the INL.

In second step S320, the BIST device may compare a measurement of an INL error I with a preset reference error I_th, based on the third and fourth output codes Z3 and Z4.

$$\text{INL error } I = |(Z3-Z4)-I2| \qquad \text{<Equation 3>}$$

Referring to Equation 3, the INL error I may be obtained by subtracting the fourth output code Z4 from the third output code Z3 and then subtracting a second normal code I2 from the value obtained through the subtraction. As an example, the second normal code I2 may be a code output in response to the third input voltage Vin3, based on the ideal curve (See FIG. 4). In the case of the 10-bit based ideal curve, the second normal code I2 may be 256.

In third step S330, if the measured ILN error I is greater than the preset reference error I_th (if YES), the BIST device makes an alarm relative to the INL error I. The BIST device ends the monitoring operations if the measured INL error I is less than the preset reference error I_th (if No).

As described above, the BIST device according to the present invention may monitor the offset error O, the gain error G, and the INL error I, based on the digital signal output from the SAR ADC 10. The SAR ADC 10 may output error-corrected digital signals, in response to information on errors detected from the BIST device.

Figure 8:
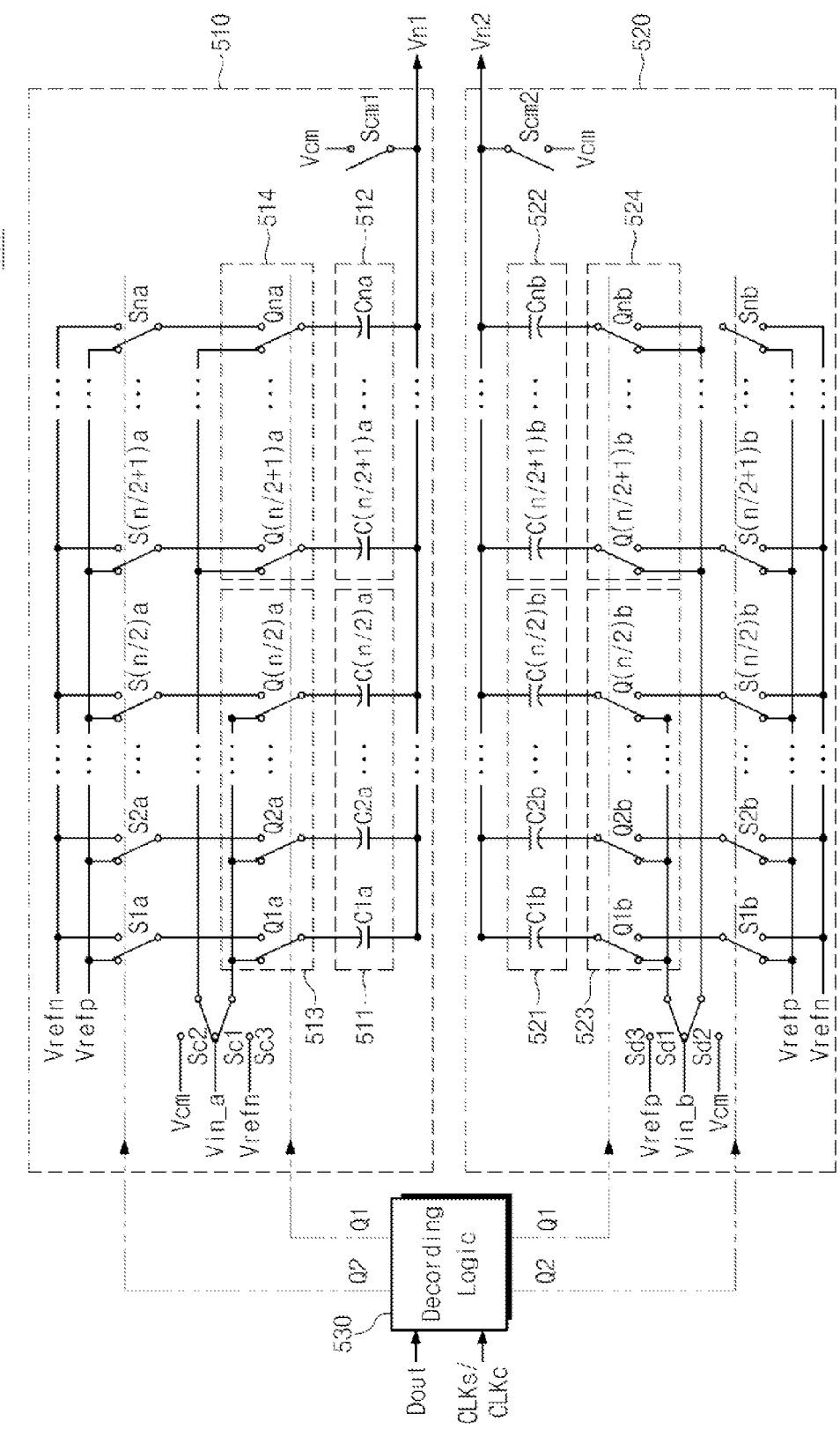
FIG. 8 is a circuit diagram of a DAC according to another embodiment of the present invention.

FIG. 8 is a circuit diagram of a DAC according to another embodiment of the present invention. Referring to FIG. 8, the DAC 500 includes a first conversion unit 510, a second conversion unit 520, and a decoding logic 530. The DAC 500 has a structure in which the third input voltage Vin3 required for measuring the INL error I described with respect to FIG. 5, namely ¼ times the supply voltage VDD may be used as the input voltage Vin. In other words, the DAC 500 according to the present invention may generate, as the input voltage Vin, 0 V or ½ times the supply voltage VDD but not ¼ times the supply voltage VDD. Thus, the DAC 500 may generate, through the distribution of capacitors, an input voltage that is ¼ times the supply voltage VDD. As an example, the input voltage Vin may have a voltage level from 0 V to the supply voltage VDD.

Also, since the digital signal output process of the DAC 400 shown in FIG. 2 is the same as that of the DAC 500, related descriptions are omitted. FIG. 8 describes how to implement an input voltage that is ¼ times the supply voltage VDD, for measuring the INL error I.

The first conversion unit 510 includes first and second capacitor units 511 and 512, first and second switch units 513 and 514, a first input switch Sc 1, a first discharge switch Sc2, and a first distribution switch Sc3. The second conversion unit 520 includes third and fourth capacitor units 521 and 522, third and fourth switch units 523 and 524, a fourth input switch Sd1, a fifth discharge switch Sd2, and a sixth distribution switch Sd3.

For the INL measurement of the BIST device, the bottom plate of the first and third capacitor units 511 and 521 may be connected to the third and sixth distribution switches Sc3 and Sd3 in response to the high level of a first control signal Q. Also, the bottom plate of the second and fourth capacitor units 512 and 522 may be connected to the second and fourth discharge switches Sc2 and Sd2 in response to the high level of the first control signal Q.

As described above, the first and second conversion units 510 and 520 may generate, through the distribution of capacitors, an input voltage that is ¼ times the supply voltage VDD. Also, the decoding logic 530 may generate first and second control signals Q1 and Q2 to be able to overall control the operations of the first and second conversion units 510 and 520.

The SAR ADC according to embodiments of the present invention may stably operate even under fluctuation in an internal supply voltage according to an external condition. Also, the SAR ADC may monitor ADC performance according to the BIST algorithm to be able to exactly determine whether there is an analog-to-digital conversion Hitherto, the embodiments are disclosed in the drawings and specification. While specific terms were used, they were not used to limit the meaning or the scope of the present invention described in Claims, but merely used to explain the present invention. Accordingly, a person having ordinary skill in the art will understand from the above that various modifications and other equivalent embodiments are also possible. Hence, the real protective scope of the present invention shall be determined by the technical scope of the accompanying claims.

What is claimed is:

1. A successive approximation register analog-to-digital converter (SAR ADC) comprising:
    a digital-to-analog converter (DAC) generating and outputting first and second level voltages based on first and second analog input signals and a reference voltage signal;
    a comparator comparing the first and second level voltages and outputting a comparison signal according to a comparison result; and
    an SAR logic generating a digital signal based on the comparison signal,
    wherein the DAC comprises:
    first and second input switches controlling reception of the first and second analog input signals, respectively;
    a first discharge switch connected electrically to the first input switch, the first discharge switch discharging leakage current according to an operation of the first input switch; and
    a second discharge switch connected electrically to the second input switch, the second discharge switch discharging leakage current according to an operation of the second input switch.

2. The successive approximation register analog-to-digital converter (SAR ADC) of claim 1, wherein the reference voltage signal is ½ times a supply voltage.

3. The successive approximation register analog-to-digital converter (SAR ADC) of claim 1, wherein the DAC comprises:
    a first conversion unit comprising a first capacitor array sampling the first analog input signal; and
    a second conversion unit comprising a second capacitor array sampling the second analog input signal,
    wherein the first analog input signal is within a range of the supply voltage and the second analog input signal is ½ times the supply voltage.

4. The successive approximation register analog-to-digital converter (SAR ADC) of claim 3, wherein the DAC further comprises a decoding logic controlling sampling operations of the first and second conversion units.

5. The successive approximation register analog-to-digital converter (SAR ADC) of claim 3, wherein the first capacitor array comprises first and second capacitor units for distributing a voltage level of the first analog input signal, and
    the second capacitor array comprises third and fourth capacitor units for distributing a voltage level of the second analog input signal.

6. The successive approximation register analog-to-digital converter (SAR ADC) of claim 3, wherein the reference voltage signal is implemented as first and second reference voltage signals, and
    for the first and second conversion units, any one of the first and second reference voltage signals is selectively supplied to a bottom plate of the first and second capacitor arrays based on the digital signal.

7. The successive approximation register analog-to-digital converter (SAR ADC) of claim 1, further comprising a clock generator generating a sampling clock and a conversion clock, wherein the DAC samples the first and second analog input signals in response to the sampling clock and outputs the first and second level voltages in response to the conversion clock.

8. The successive approximation register analog-to-digital converter (SAR ADC) of claim 7, wherein the SAR logic outputs the digital signal based on the comparison result signal output from the comparator, in response to the conversion clock.

9. The successive approximation register analog-to-digital converter (SAR ADC) of claim 1, wherein the first input switch and the first discharge switch performs a complementary operation with the second input switch and the second discharge switch.

10. A method of operating a built-in self-test (BIST) device for testing a successive approximation register analog-to-digital converter (SAR ADC), the method comprising:
    storing first and second output codes in response to first and second input voltages;

outputting a gain error based on a calculation result of a difference between the stored first and second output codes and a first normal code according to the second input voltage;

storing third and fourth output codes in response to the second input voltage and the third input voltage;

outputting an offset error based on a calculation result of the stored third output code and the first normal code; and outputting an integral non-linearity (INL) error based on a calculation result of a difference between the stored third and fourth output codes and a second normal code according to the third input voltage, wherein the SAR ADC receives a signal corresponding to the offset error from the BIST device and outputs an offset-corrected digital signal.

11. The method of claim 10, further comprising comparing the gain error with a reference gain error corresponding to the gain error;

comparing the offset error with a reference offset error corresponding to the offset error; and comparing the INL error with a reference INL error corresponding to the INL error.

12. The method of claim 11, further comprising generating alarm signals according to comparison results with the reference gain error, the reference offset error, and the reference INL error, respectively.

13. The method of claim 10, wherein the first and second output codes output in response to the first and second input voltages are output based on a preset compensation code.

* * * * *